(12) United States Patent
Doo et al.

(10) Patent No.: US 9,059,698 B2
(45) Date of Patent: Jun. 16, 2015

(54) INTEGRATED CIRCUIT DEVICES USING POWER SUPPLY CIRCUITS WITH FEEDBACK FROM A REPLICA LOAD

(75) Inventors: Su-yeon Doo, Seoul (KR); Seung-jun Bae, Hwaseong-si (KR); Kwang-il Park, Yongin-si (KR); Young-soo Sohn, Seoul (KR)

(73) Assignee: Samsung Electronics Co., Ltd. (KR)

( * ) Notice: Subject to any disclaimer, the term of this patent is extended or adjusted under 35 U.S.C. 154(b) by 861 days.

(21) Appl. No.: 13/240,635

(22) Filed: Sep. 22, 2011

(65) Prior Publication Data

US 2012/0086490 A1    Apr. 12, 2012

Related U.S. Application Data

(60) Provisional application No. 61/391,889, filed on Oct. 11, 2010.

(30) Foreign Application Priority Data

Dec. 13, 2010  (KR) ................... 10-2010-0127096

(51) Int. Cl.
 *G05F 1/00* (2006.01)
 *H03K 19/003* (2006.01)
 *G05F 1/575* (2006.01)

(52) U.S. Cl.
 CPC .......... *H03K 19/00361* (2013.01); *G05F 1/575* (2013.01)

(58) Field of Classification Search
 CPC ................................. G05F 1/00; G05F 1/575
 USPC .......... 323/223–226, 268–273, 275, 280, 281
 See application file for complete search history.

(56) References Cited

U.S. PATENT DOCUMENTS

| | | | | |
|---|---|---|---|---|
| 7,362,079 | B1 * | 4/2008 | Maheedhar et al. | 323/269 |
| 8,080,984 | B1 * | 12/2011 | Geynet | 323/280 |
| 8,237,418 | B1 * | 8/2012 | Krishna | 323/273 |
| 2013/0293986 | A1 * | 11/2013 | Lerner et al. | 361/18 |
| 2014/0084878 | A1 * | 3/2014 | Tomioka et al. | 323/225 |

FOREIGN PATENT DOCUMENTS

| | | |
|---|---|---|
| JP | 2004-247805 | 9/2004 |
| JP | 2008-167094 | 7/2008 |
| KR | 1020100005756 | 1/2010 |

* cited by examiner

*Primary Examiner* — Matthew Nguyen
(74) *Attorney, Agent, or Firm* — Myers Bigel Sibley & Sajovec, P.A.

(57) ABSTRACT

An integrated circuit device includes an external power supply input configured to be coupled to an external power supply and a digital circuit, such as a clock signal generator circuit, that generates noise at a power supply input thereof. The device further includes a replica load circuit and a power supply circuit coupled to the external power supply input, to a power supply input of the digital circuit and to a power supply input of the replica load circuit. The power supply circuit is configured to selectively couple the external power supply node to the power supply input of the digital circuit responsive to a voltage at the power supply input of the replica load circuit. The replica load circuit may be configured to provide a load that varies responsive to a voltage at the power supply input of the digital circuit.

7 Claims, 9 Drawing Sheets

INTEGRATED CIRCUIT DEVICES USING POWER SUPPLY CIRCUITS WITH FEEDBACK FROM A REPLICA LOAD

CROSS-REFERENCE TO RELATED APPLICATIONS

This application claims the benefit of U.S. Provisional Patent Application No. 61/391,889, filed on Oct. 11, 2010, in the U.S. Patent and Trademark Office, and the benefit of Korean Patent Application No. 10-2010-0127096, filed on Dec. 13, 2010, in the Korean Intellectual Property Office, the disclosures of which are incorporated herein their entirety by reference.

BACKGROUND

The inventive subject matter relates to integrated circuit devices and, more particularly, to power supply circuits in integrated circuit devices.

Semiconductor integrated circuit devices used in computers or mobile devices have become increasingly integrated and provide increasing performance. Various attempts have been made to manufacture smaller semiconductor devices with increased memory capacity and operating speed.

It is generally desirable to stabilize the operating voltage of such a device. In particular, jitter characteristics of clock generator circuits that generate various clock signals in the semiconductor device generally become more important as the speed of the semiconductor device increases. Decreasing a power noise of the operating voltage may reduce jitter. Accordingly, some semiconductor devices employ voltage regulators having a high Power Supply Rejection Ratio (PSRR).

SUMMARY

Some embodiments of the inventive subject matter provide an integrated circuit device including an external power supply node configured to be connected to an external power supply and an internal power supply node configured to provide power to internal circuitry of the integrated circuit device. The device also includes a replica power supply node and a replica load circuit coupled to the replica power supply node. The device further includes a regulator circuit configured to generate an internal power supply voltage at the internal power supply node and a replica power supply voltage at the replica power supply node from the external power supply responsive to the replica power supply voltage.

In some embodiments, the regulator circuit is configured to generate the internal power supply voltage and the replica power supply voltage responsive to a comparison of the replica power supply voltage to a reference voltage. The regulator circuit may be configured to generate an internal power supply voltage at the internal power supply node and a replica power supply voltage at the replica power supply node from the external power supply responsive to the replica power supply voltage and the internal power supply voltage. The regulator circuit may be configured to generate the internal power supply voltage and the replica power supply voltage responsive to a comparison of the replica power supply voltage to a reference voltage and to a comparison of the internal power supply voltage to the reference voltage.

In some embodiments, the regulator circuit may include an amplifier circuit configured to compare the reference voltage to the internal power supply voltage and the reference voltage to the replica voltage and to responsively generate an output signal, a first switch coupled to the amplifier circuit and configured to selectively couple the external power supply node to the internal power supply node responsive to the output signal and a second switch coupled to the amplifier circuit and configured to selectively couple the external power supply node to the replica power supply node responsive to the output signal. The amplifier circuit may include a first amplifier configured to compare the reference voltage to the replica power supply voltage and a second amplifier having an output coupled to the output the first amplifier and configured to compare the reference voltage to the internal power supply voltage. The first and second switches may include respective first and second p-channel metal-oxide-semiconductor field-effect (PMOS) transistors.

In some embodiments, the replica load circuit may include an amplifier circuit configured to comparing the reference voltage to the internal power supply voltage to generate an output signal and a switch coupled to the amplifier circuit and configured to selectively couple the replica power supply node to a ground node responsive to the output signal. The switch may include an n-channel metal-oxide-semiconductor field-effect (NMOS) transistor.

In further embodiments of the inventive subject matter, an integrated circuit device includes an amplifier circuit coupled to an internal power supply node and to a replica power supply node and configured to compare a reference voltage to an internal power supply voltage at the internal power supply voltage and to a replica power supply voltage at the replica power supply node to generate an output signal. The device further includes a first switch configured to selectively couple an external power supply to the internal power supply node responsive to the output signal and a second switch configured to selectively couple the external power supply to the replica voltage node responsive to the output signal. A clock signal generator circuit is coupled to the internal power supply node and a replica load circuit is coupled to the replica power supply node.

The amplifier circuit may include a first amplifier configured to compare the reference voltage to the replica voltage and a second amplifier having an output coupled to the output of the first amplifier and configured to compare the reference voltage to the internal power voltage, and outputting the output signal. The first and second switches may include respective first and second PMOS transistors.

In some embodiments, the amplifier circuit includes a first amplifier circuit configured to compare the reference voltage to the internal power supply voltage and to the replica power supply voltage to generate an first output signal and the replica load circuit includes a second amplifier circuit configured to compare the reference voltage to the internal power supply voltage to generate a second output signal and a third switch configured to couple the replica power supply node to a ground node responsive to the second output signal. The third switch may include an NMOS transistor.

In still further embodiments, an integrated circuit device includes an external power supply input configured to be coupled to an external power supply and a digital circuit, such as a clock signal generator circuit, that generates noise at a power supply input thereof. The device further includes a replica load circuit and a power supply circuit coupled to the external power supply input, to a power supply input of the digital circuit and to a power supply input of the replica load circuit. The power supply circuit is configured to, selectively couple the external power supply node to the power supply input of the digital circuit responsive to a voltage at the power supply input of the replica load circuit. The replica load circuit may be configured to provide a load that varies responsive to a voltage at the power supply input of the digital circuit.

In some embodiments, the power supply circuit is configured to selectively couple the external power supply node to the power supply input of the digital circuit and to the power supply input of the replica load circuit responsive to the voltage at the power supply input of the replica load circuit and to a voltage at the power supply input of the digital circuit.

In some embodiments, the power supply circuit may include respective first and second switches configured to couple the power supply inputs of the digital circuit and the replica load circuit to the external power supply input and a control circuit coupled to the power supply inputs of the digital circuit and the replica load circuit and configured to control the first and second switches. The control circuit may be configured to compare the voltages at the power supply inputs of the digital circuit and the replica load circuit to a reference voltage and to control the first and second switches responsive to the comparison.

Some embodiments of the inventive subject matter provides a voltage regulator using a closed feedback loop, a semiconductor device and an electronic system including the voltage regulator, and a method of generating a voltage.

According to an aspect of the inventive subject matter, there is provided a voltage regulator including a control circuit comparing a reference voltage to an internal power voltage, comparing the reference voltage to a replica voltage, and generating the internal power voltage and the replica voltage from an external power voltage, according to results of the comparison; and a replica load circuit comparing the reference voltage to the internal power voltage and controlling the replica voltage according to a result of the comparison while generating the replica voltage having the same level as a level of the internal power voltage.

The voltage regulator may further include a circuit driven by the internal power voltage and performing a circuit operation, wherein the level of the internal power voltage varies according to the circuit operation.

The control circuit may include an amplifier comparing the reference voltage to the internal power voltage, comparing the reference voltage to the replica voltage, and generating an output signal; a first switch supplying the external power voltage to the internal power voltage in response to the output signal of the amplifier; and a second switch supplying the external power voltage to the replica voltage in response to the output signal of the amplifier.

The amplifier may include a first amplifier comparing the reference voltage to the replica voltage, and outputting the output signal; and a second amplifier comparing the reference voltage to the internal power voltage, and outputting the output signal.

The first switch may be a p-channel metal-oxide-semiconductor field-effect (PMOS) transistor whose source is connected to the external power voltage, whose gate is connected to the output signal of the amplifier, and whose drain is connected to the internal power voltage.

The second switch may be a PMOS transistor whose source is connected to the external power voltage, whose gate is connected to the output signal of the amplifier, and whose drain is connected to the replica voltage.

The replica load circuit may include an amplifier comparing the reference voltage to the internal power voltage, and generating an output signal; and a switch connected between the replica voltage and a ground voltage, and turned on in response to the output signal of the amplifier.

The switch may be an n-channel metal-oxide-semiconductor field-effect (NMOS) transistor whose drain is connected to the replica voltage, whose gate is connected to the output signal of the amplifier, and whose source is connected to the ground voltage.

According to another aspect of the inventive subject matter, there is provided a voltage regulator including an amplifier comparing a reference voltage to an internal power voltage, comparing the reference voltage to a replica voltage, and generating an output signal; a first switch supplying an external power voltage to an internal power voltage in response to the output signal of the amplifier; a second switch supplying the external power voltage to the replica voltage in response to the output signal of the amplifier; a clock generator circuit connected between the internal power voltage and a ground voltage, and generating clock signals varying a level of the internal power voltage; and a replica load circuit connected between the replica voltage and the ground voltage, having the same load as a load of the clock generator circuit, comparing the internal power voltage to the reference voltage, and controlling the replica voltage according to a result of the comparison.

According to another aspect of the inventive subject matter, there is provided a method of generating a voltage, the method including the operations of comparing a reference voltage to an internal power voltage, comparing the reference voltage to a replica voltage, and generating the internal power voltage and the replica voltage from an external power voltage, according to results of the comparison; and comparing the reference voltage to the internal power voltage and controlling the replica voltage according to a result of the comparison while generating the replica voltage having the same level as a level of the internal power voltage, wherein the level of the internal power voltage converges to a reference voltage.

According to another aspect of the inventive subject matter, there is provided an electronic system including a semiconductor device including a voltage regulator generating an internal power voltage; and a processor device controlling the semiconductor device, wherein the voltage regulator compares a reference voltage to the internal power voltage, compares the reference voltage to a replica voltage, generates the internal power voltage and the replica voltage from an external power voltage, according to results of the comparison, compares the reference voltage to the internal power voltage and controls the replica voltage according to a result of the comparison while the voltage regulator generates the replica voltage having the same level as a level of the internal power voltage.

The semiconductor device may be a non-volatile memory device, and the non-volatile memory device and the processor device may form a semiconductor disk device.

The semiconductor device may be a memory device, and the memory device and the processor device may form a memory card.

BRIEF DESCRIPTION OF THE DRAWINGS

Exemplary embodiments of the inventive subject matter will be more clearly understood from the following detailed description taken in conjunction with the accompanying drawings in which.

DETAILED DESCRIPTION

Figure 1:
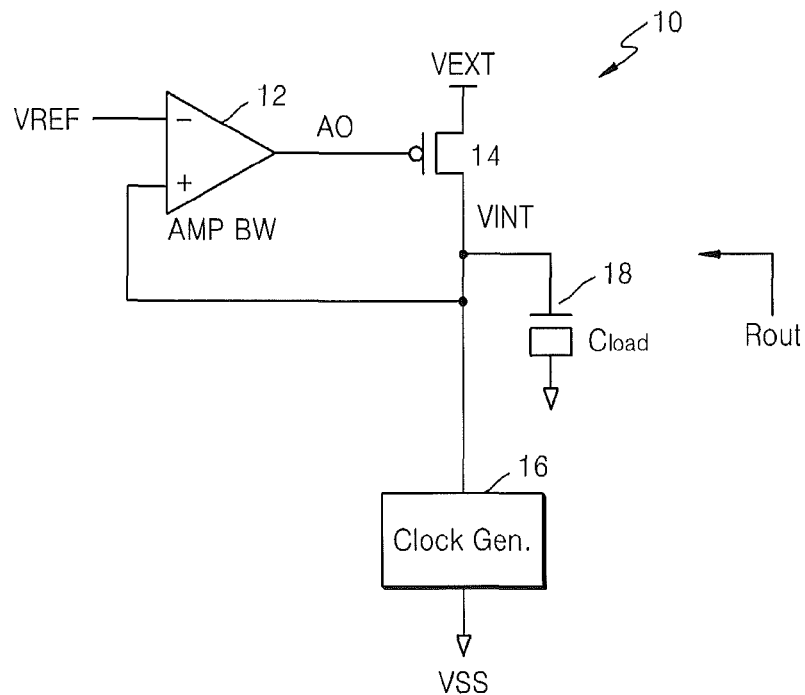
FIG. 1 illustrates a voltage regulator generating an internal power voltage of a semiconductor device according to some embodiments of the inventive subject matter.

The inventive subject matter will now be described more fully with reference to the accompanying drawings, in which exemplary embodiments of the inventive subject matter are shown. The inventive subject matter may, however, be embodied in many different forms and should not be construed as being limited to the embodiments set forth herein; rather, these embodiments are provided so that this disclosure will be thorough and complete, and will fully convey the inventive subject matter to those of ordinary skill in the art. In the drawings, similar reference numerals denote similar configuring elements, and the thicknesses of layers and regions are exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operations, a component, and/or groups thereof, not excluding the existence of one or more other recited forms, one or more other numbers, one or more other processes, one or more other operations, one or more other components and/or groups thereof.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items.

FIG. 1 illustrates a voltage regulator 10 generating an internal power voltage of an integrated circuit (semiconductor) device according to some embodiments of the inventive subject matter. Referring to FIG. 1, the voltage regulator 10 includes an amplifier 12, a switch 14, a clock generator circuit 16 (e.g., a clock tree or similar circuitry), and a load capacitor 18.

The amplifier 12 compares a reference voltage VREF and a voltage at an internal power voltage node VINT, and generates an output signal AO. The reference voltage VREF is applied to a negative (−) terminal of the amplifier 12, and the internal power voltage node VINT is connected to a positive (+) terminal of the amplifier 12. When the voltage of the internal power voltage node VINT is less than the reference voltage VREF, the amplifier 12 may generate an output signal AO at a logic low level, and when the voltage at the internal power voltage node VINT is greater than the reference voltage VREF, the amplifier 12 may generate an output signal AO at a logic high level.

In response to the output signal AO of the amplifier 12, the switch 14 couples an external power voltage node VEXT to the internal power voltage node VINT. The switch 14 may include a p-channel metal-oxide-semiconductor field-effect (PMOS) to which the external power voltage node VEXT is connected to a source of the switch 14, the output signal AO of the amplifier 12 is connected to a gate of the switch 14, and the internal power voltage node VINT is connected to a drain of the switch 14. The switch 14 may be turned on in response to the output signal AO at the logic low level to couple the external power voltage node VEXT to the internal power voltage node VINT. The switch 14 may be turned off in response to the output signal AO at the logic high level to decouple the external power voltage node VEXT.

The clock generator circuit 16 may be connected between the internal power voltage node VINT and a ground voltage source VSS, and may generate a clock signal (not shown) having a period determined according to the voltage at the internal power voltage node VINT. The clock generator circuit 16 may include a ring oscillator including one or more inverters or including one or more differential amplifiers. The load capacitor 18 may be connected between the internal power voltage node VINT and the ground voltage source VSS, and may be disposed in consideration of a capacitive load to be driven by the voltage regulator 10.

In the voltage regulator 10, the voltage at the internal power voltage node VINT is compared to the reference voltage VREF, and if the voltage at the internal power voltage node VINT is less than the reference voltage VREF, the output signal AO of the amplifier 12 is generated at the logic low level so that the PMOS transistor that is the switch 14 is turned on. Accordingly, the external power voltage node VEXT is coupled to the internal power voltage node VINT so that the voltage at the internal power voltage node VINT is increased. If the voltage at the internal power voltage node VINT is greater than the reference voltage VREF, the output signal AO of the amplifier 12 is generated at the logic high level so that the PMOS transistor that is the switch 14 is turned off.

In the voltage regulator 10, a characteristic of power noise may be very important in generating the voltage at the internal power voltage node VINT from the external power voltage node VEXT. The characteristic of power noise may be indicated as a noise ratio of the voltage at the internal power voltage node VINT and the external power voltage node VEXT, that is, $VINT_{noise}/VEXT_{noise}$. The characteristic of power noise of the voltage regulator 10 is illustrated in FIG. 2.

Figure 2:
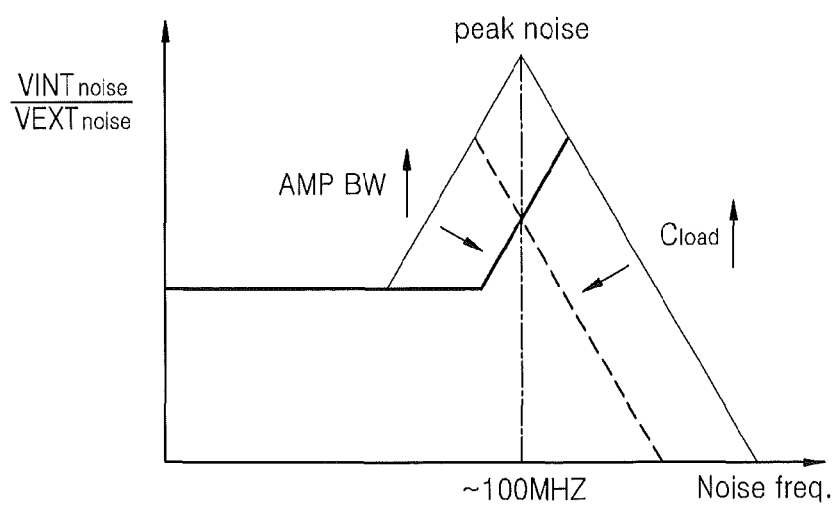
FIG. 2 illustrates a characteristic of power noise for each frequency in the voltage regulator of FIG. 1.

FIG. 2 is a graph that illustrates a characteristic of power noise for each frequency in the voltage regulator 10 of FIG. 1. Referring to FIG. 2, it can be seen that power noise of the voltage regulator 10 has a peak noise at about 100 MHz (see thin solid line). In order to decrease high-frequency power noise, a bandwidth BW of the amplifier 12 may be decreased at frequencies greater than 100 MHz. At a frequency greater than 100 MHz, the load capacitor 18 may be increased (shown by a thick dashed line). Power noise at high frequencies may be thus decreased using an RC filtering effect.

A gain $A_v$ of the voltage regulator 10 may be given by Equation (1):

$$A_v = -g_m R_{out},$$

where $g_m$ indicates a gain of the amplifier 12, and $R_{out}$ indicates an output resistance with respect to the internal power voltage node VINT that is an output node of the voltage regulator 10. Increasing the output resistance $R_{out}$ may, therefore, increase the gain $A_v$.

The bandwidth BW of the amplifier 12 is dominant in a first pole, as defined by Equation 2:

$$w_{p1} \approx \frac{1}{R_{out} C_{Load}},$$

where $w_{p1}$ indicates a frequency of the first pole of the amplifier 12, and $C_{Load}$ indicates a capacitance of the load capacitor 18.

When a gain $A_v$ of the voltage regulator 10 is increased by increasing the output resistance $R_{out}$, the bandwidth BW of the amplifier 12 is decreased. In order to increase the bandwidth BW of the amplifier 12, the output resistance $R_{out}$ may be decreased. In order to decrease the output resistance $R_{out}$, a gate width W of the PMOS transistor switch 14 may be increased. The current flowing in the PMOS transistor switch 14 may be given by Equation 3:

$$I_{out} = \frac{1}{2} \mu C_{ox} \left(\frac{W}{L}\right)(V_{GS} - V_{TH})^2,$$

where $\mu$ indicates electron mobility, $C_{ox}$ indicates a gate oxide capacitance of the PMOS transistor, L indicates a gate length of the PMOS transistor, $V_{GS}$ indicates a voltage between the gate and the source of the PMOS transistor, and $V_{TH}$ indicates a threshold voltage of the PMOS transistor.

If the bandwidth BW of the amplifier 12 is increased and the output resistance $R_{out}$ is increased in order to decrease the power noise at lower frequencies, this may cause an increase in the power consumption of the voltage regulator 10. If the load capacitor 18 is increased in order to decrease the power noise at greater frequencies, this may cause an increase in the size of the semiconductor device.

Figure 3:
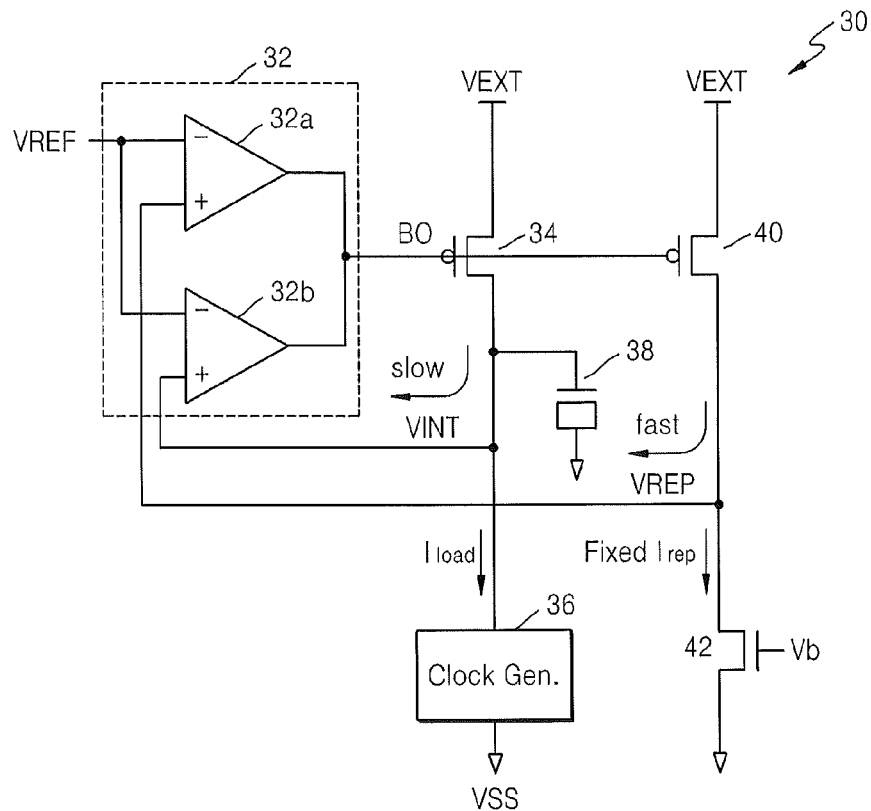
FIG. 3 illustrates a voltage regulator generating an internal power voltage of a semiconductor device according to further embodiments of the inventive subject matter.

FIG. 3 illustrates a voltage regulator 30 configured to generate an internal power voltage of a semiconductor device according to further embodiments of the inventive subject matter. Referring to FIG. 3, the voltage regulator 30 includes an amplifier 32, a first switch 34, a clock generator circuit 36 (e.g., a clock tree or component thereof), a load capacitor 38, a second switch 40, and a replica load circuit 42. The amplifier 32 compares a reference voltage VREF to a voltage at an internal power voltage node VINT, compares the reference voltage VREF to a voltage at the replica voltage node VREP, and outputs an output signal BO. The amplifier 32 includes a first amplifier 32a that compares the reference voltage VREF to the voltage at the replica voltage node VREP and outputs the output signal BO, and a second amplifier 32b that compares the reference voltage VREF to the voltage at the internal power voltage node VINT and outputs the output signal BO. The reference voltage VREF is provided to a negative (−) terminal of the first amplifier 32a, and the voltage at the replica voltage node VREP is provided to a positive (+) terminal of the first amplifier 32a. The reference voltage VREF is provided to a negative (−) terminal of the second amplifier 32b, and the internal power voltage node VINT is connected to a positive (+) terminal of the second amplifier 32b.

The voltage regulator 30 may be designed in such a manner that the internal power voltage node VINT and the replica voltage node VREP that are input to the amplifier 32 have almost the same voltage level. Here, it is assumed that the voltages at the internal power voltage node VINT and the replica voltage node VREP are equal. If the voltages at the internal power voltage node VINT and the replica voltage node VREP are less than the reference voltage VREF, the first and second amplifiers 32a and 32b output an output signal BO at a logic low level. If the voltage at the internal power voltage node VINT and the voltage at the replica voltage node VREP are greater than the reference voltage VREF, the first and second amplifiers 32a and 32b output an output signal BO at a logic high level. The output signal BO of the amplifier 32 is connected to the first switch 34 and the second switch 40.

The first switch 34 couples an external power voltage node VEXT to the internal power voltage node VINT in response to the output signal BO of the amplifier 32. The first switch 34 may include a first PMOS transistor. The external power voltage node VEXT is coupled to a source of the first switch 34, the output signal BO of the amplifier 32 is applied to a gate of the first switch 34, and the internal power voltage node VINT is connected to a drain of the first switch 34. The first switch 34 may be turned on in response to the output signal BO of the amplifier 32 which is at the logic low level and then may coupled the external power voltage node VEXT to the internal power voltage node VINT. The first switch 34 may be turned off in response to the output signal BO of the amplifier 32 which is at the logic high level and then may decouple the external power voltage node VEXT from the internal power voltage node VINT.

The clock generator circuit 36 may be connected between the internal power voltage node VINT and a ground voltage source VSS, and may generate a clock signal (not shown) having a period determined according to the voltage at the internal power voltage node VINT. The clock generator circuit 36 may include a ring oscillator including one or more inverters or including one or more differential amplifiers. The clock generator circuit 36 may be driven according to the voltage at the internal power voltage node VINT, and the voltage at the internal power voltage node VINT may vary when the clock generator circuit 36 generates a clock signal having a high frequency. That is, according to an operation of the clock generator circuit 36, jitter noise may occur in the internal power voltage node VINT. The jitter noise of the clock generator circuit 36 may be compensated for by the replica load circuit 42 to be described below.

The load capacitor 38 is connected between the internal power voltage node VINT and the ground voltage source VSS. The load capacitor 38 may be disposed in consideration of a capacitive load to be driven by the voltage regulator 30.

The second switch 40 couples the external power voltage node VEXT to the replica voltage node VREP, in response to the output signal BO of the amplifier 32. The second switch 40 may include a second PMOS transistor to which the external power voltage node VEXT is connected to a source of the second switch 40, the output signal BO of the amplifier 32 is connected to a gate of the second switch 40, and the internal power voltage node VINT is connected to a drain of the second switch 40.

The second switch 40 may be turned on in response to the output signal BO of the amplifier 32 which is at the logic low level and then may couple the external power voltage node VEXT to the replica voltage node VREP. The second switch 40 may be turned off in response to the output signal BO of the amplifier 32, which is at the logic high level.

In order to compensate for the jitter noise of the clock generator circuit 36, the replica load circuit 42 may have a load corresponding to a replica of the clock generator circuit 36. The replica load circuit 42 may include an NMOS transistor connected between the replica voltage node VREP and the ground voltage source VSS. The replica voltage node VREP may be connected to a drain of the NMOS transistor, a bias voltage Vb may be connected to a gate of the NMOS transistor, and the ground voltage source VSS may be connected to a source of the NMOS transistor. The NMOS transistor may be turned on according to the bias voltage Vb, and a level of the bias voltage Vb may be set so that a turn-on resistance of the NMOS transistor, and a load of the clock generator circuit 36 may become almost equal to each other.

In the voltage regulator 30, due to the first switch 34 and the second switch 40 equally responding to the output signal BO of the amplifier 32, the replica load circuit 42 having a load almost equal to that of the clock generator circuit 36, and a connection relation therebetween, the internal power voltage node VINT between the first switch 34 and the clock generator circuit 36 may have a voltage almost equal to the voltage at the replica voltage node VREP between the second switch 40 and the replica load circuit 42.

The voltage at the internal power voltage node VINT generated between the first switch 34 and the clock generator circuit 36 is linked with an operation of the clock generator circuit 36, so that the voltage at the internal power voltage node VINT may be slowly generated, as compared to the voltage at the replica voltage node VREP. For example, due to jitter of the clock generator circuit 36, it may take time to stabilize the voltage at the internal power voltage node VINT. On the other hand, the voltage at the replica voltage node VREP generated between the second switch 40 and the replica load circuit 42 is linked with only an operation of the NMOS transistor that is turned on according to the bias voltage Vb, so that the voltage at the replica voltage node VREP may be rapidly generated, as compared to the voltage at the internal power voltage node VINT.

The voltage regulator 30 may compare the voltage at the replica voltage node VREP, which is rapidly fed back to the amplifier 32, with the reference voltage VREF, may generate the output signal BO of the amplifier 32 according to a result of the comparison, may control the first switch 34 and the second switch 40 in response to the output signal BO, and may generate the voltage at the internal power voltage node VINT and the voltage at the replica voltage node VREP.

Figure 4:
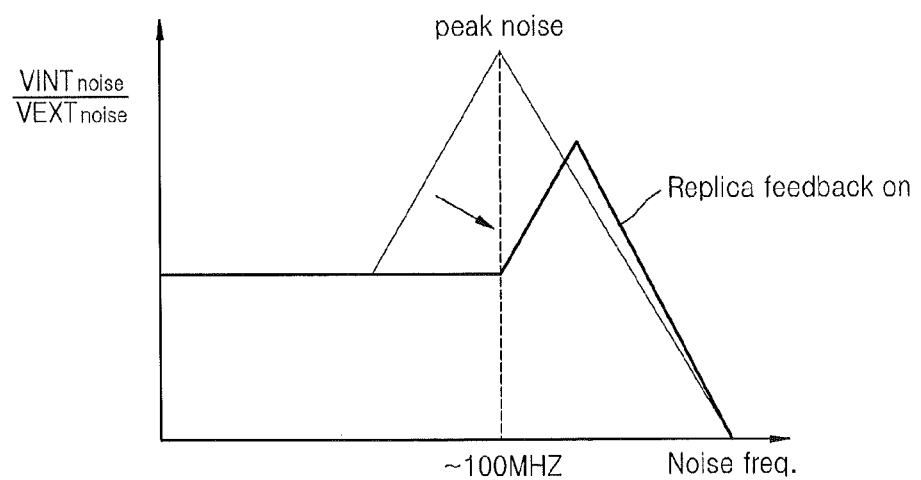
FIG. 4 illustrates a characteristic of power noise of the voltage regulator of FIG. 3.

FIG. 4 illustrates a characteristic of power noise of the voltage regulator 30 of FIG. 3. Referring to FIG. 4, it can be seen that the power noise (a thick solid line) of the voltage regulator 30 of FIG. 3 to which a voltage at the replica voltage node VREP is fed back is less than a power noise (a thin solid line) of the voltage regulator 10 of FIG. 2. This means that it is possible to obtain the same result as a method of decreasing a power noise by increasing a bandwidth BW of the amplifier 12 with respect to the power noise of the voltage regulator 10 of FIG. 2.

In the voltage regulator 30 of FIG. 3, the bias voltage Vb for controlling the replica load circuit 42 may have a fixed voltage level so that the turn-on resistance of the NMOS transistor that is the replica load circuit 42 may become almost equal to the load of the clock generator circuit 36. Due to the bias voltage Vb having the fixed voltage level, a current $I_{rep}$ flowing in the replica load circuit 42 may have a fixed current value. Accordingly, the replica voltage node VREP may have a fixed voltage level.

A current $I_{load}$ flowing in the clock generator circuit 36 may vary due to variables of a semiconductor device including the voltage regulator 30, and the variables may include a process, a power supply voltage, and a temperature (hereinafter, referred to as "PVT"). When the current $I_{load}$ flowing in the clock generator circuit 36 is changed, the voltage at the internal power voltage node VINT may also be changed. The load of the clock generator circuit 36 and a load of the replica load circuit 42, which are initially set to be equal to each other, may be mismatched by the PVT and an operating frequency of the semiconductor device. In this case, the voltage at the internal power voltage node VINT may be different from the voltage at the replica voltage node VREP that is generated in response to the fixed bias voltage Vb. Since the voltage at the internal power voltage node VINT and the voltage at the replica voltage node VREP are different from each other, performances and characteristics of the voltage regulator 30 may be changed.

If it is possible to feed back a change of the current $I_{load}$ flowing in the clock generator circuit 36, which is caused by the PVT and the operating frequency of the semiconductor device, to the amplifier 32, the internal power voltage node VINT and the replica voltage node VREP may be matched to have the same voltage. Accordingly, it is necessary to form a voltage regulator that is insensitive to the PVT and the operating frequency of the semiconductor device.

Figure 5:
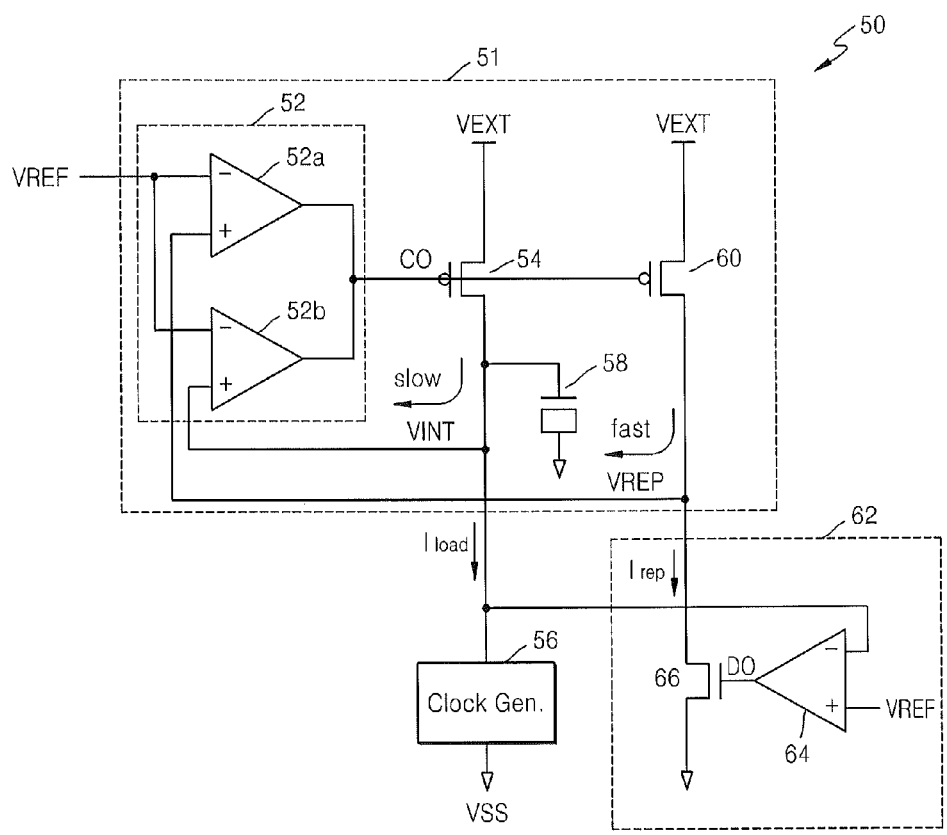
FIG. 5 illustrates a voltage regulator according to further embodiments of the inventive subject matter.

FIG. 5 illustrates a voltage regulator 50 according to further embodiments of the inventive subject matter. Referring to FIG. 5, the voltage regulator 50 controls an internal power voltage node VINT to be generated from a voltage at an external power voltage node VEXT by using a reference voltage VREF, and controls a voltage at the internal power voltage node VINT to converge to a reference voltage VREF. The voltage regulator 50 includes a control circuit 51, a clock generator circuit 56, and a replica load circuit 62.

The control circuit 51 compares the reference voltage VREF to the voltage of the internal power voltage node VINT, and compares the reference voltage VREF to a voltage at the replica voltage node VREP. According to results of the comparison, the control circuit 51 generates the internal power voltage node VINT and the voltage at the replica voltage node VREP from the external power voltage node VEXT. The control circuit 51 includes an amplifier 52, a first switch 54, and a second switch 60.

The amplifier 52 includes a first amplifier 52a that compares the reference voltage VREF to the voltage at the replica voltage node VREP and outputs an output signal CO, and a second amplifier 52b that compares the reference voltage VREF to the voltage at the internal power voltage node VINT and outputting an output signal CO. The reference voltage VREF is connected to a negative (−) terminal of the first amplifier 52a, and the replica voltage node VREP is connected to a positive (+) terminal of the first amplifier 52a. The reference voltage VREF is connected to a negative (−) terminal of the second amplifier 52b, and the internal power voltage node VINT is connected to a positive (+) terminal of the second amplifier 52b.

The voltage regulator 50 may be designed in such a manner that the internal power voltage node VINT and the voltage at the replica voltage node VREP that are input to the amplifier 52 have almost the same voltage level. Here, it is assumed that the voltages of the internal power voltage node VINT and the replica voltage node VREP are equal. If the voltage at the internal power voltage node VINT and the voltage at the replica voltage node VREP are less than the reference voltage VREF, the first and second amplifiers 52a and 52b output an output signal BO at a logic low level. If the voltage at the internal power voltage node VINT and the voltage at the replica voltage node VREP are greater than the reference voltage VREF, the first and second amplifiers 52a and 52b output an output signal CO at a logic high level. The output signal CO of the amplifier 52 is connected to the first switch 54 and the second switch 60.

The first switch 54 couples the external power voltage node VEXT to the internal power voltage node VINT in response to the output signal CO of the amplifier 52. The first switch 54 may include a first PMOS transistor to which the external power voltage node VEXT is connected to a source of the first switch 54, the output signal CO of the amplifier 52 is connected to a gate of the first switch 54, and the internal power voltage node VINT is connected to a drain of the first switch 54. The first switch 54 may be turned on in response to the output signal CO of the amplifier 52 which is at the logic low level and then may couple the external power voltage node VEXT to the internal power voltage node VINT. The first switch 54 may be turned off in response to the output signal CO of the amplifier 52 which is at the logic high level.

The second switch 60 couples the external power voltage node VEXT to the replica voltage node VREP in response to the output signal CO of the amplifier 52. The second switch 60 may include a second PMOS transistor to which the external power voltage node VEXT is connected to a source of the second switch 60, the output signal CO of the amplifier 52 is connected to a gate of the second switch 60, and the internal power voltage node VINT is connected to a drain of the second switch 60. The second switch 60 may be turned on in response to the output signal CO of the amplifier 52 which is at the logic low level and then may couple the external power voltage node VEXT to the replica voltage node VREP. The second switch 60 may be turned off in response to the output signal CO of the amplifier 52 which is at the logic high level.

The clock generator circuit 56 may be connected between the internal power voltage node VINT and a ground voltage source VSS, and may generate a clock signal (not shown) having a period determined according to the internal power voltage node VINT. The clock generator circuit 56 may include a ring oscillator including one or more inverters or including one or more differential amplifiers. The clock generator circuit 56 may be driven according to the internal power voltage node VINT, and a voltage at the internal power voltage node VINT may vary when the clock generator circuit 56 generates a clock signal having a high frequency. That is, according to an operation of the clock generator circuit 56, jitter noise may occur in the internal power voltage node VINT. The jitter noise of the clock generator circuit 56 may be compensated for by the replica load circuit 62 to be described below.

In the present embodiments, a voltage at the internal power voltage node VINT is changed by the clock generator circuit 56. The clock generator circuit 56 may be replaced with another circuit that is driven according to the internal power voltage node VINT and varies the voltage at the internal power voltage node VINT according to an operation of the other circuit.

In the voltage regulator 50, the load capacitor 58 may be further disposed between the internal power voltage node VINT and the ground voltage source VSS, in consideration of a capacitive load to be driven by the voltage regulator 50. The load capacitor 58 may decrease power noise having a high frequency by using an RC filtering effect.

In order to compensate for the jitter noise of the clock generator circuit 56, the replica load circuit 62 may have the same load as the clock generator circuit 56. The replica load circuit 62 may control the replica voltage node VREP with the same level to be generated according to the voltage at the internal power voltage node VINT that is changed by the clock generator circuit 56. The replica load circuit 62 may compare the reference voltage VREF and the internal power voltage node VINT, and may generate the voltage at the replica voltage node VREP, according to a result of the comparison.

The replica load circuit 62 may include a third amplifier 64 that compares the reference voltage VREF to the internal power voltage node VINT and outputting an output signal DO, and an NMOS transistor 66 generating the voltage at the replica voltage node VREP in response to the output signal DO of the third amplifier 64. The internal power voltage node VINT may be connected to a negative (−) terminal of the third amplifier 64, and the reference voltage VREF may be connected to a positive (+) terminal of the third amplifier 64. The replica voltage node VREP may be connected to a drain of the NMOS transistor 66, an output of the third amplifier 64 may be connected to a gate of the NMOS transistor 66, and the ground voltage source VSS may be connected to a source of the NMOS transistor 66.

If the voltage at the internal power voltage node VINT is less than a reference voltage VREF, the third amplifier 64 may generate the output signal DO at a logic high level. The output signal DO of the third amplifier 64, which is at the logic high level, decreases a voltage at the replica voltage node VREP by turning on the NMOS transistor 66.

If the voltage at the internal power voltage node VINT is less than the reference voltage VREF, the output signal CO of the first amplifier 52a is generated at a logic low level, the second PMOS transistor that is the second switch 60 is turned on in response to the output signal CO of the first amplifier 52a which is at the logic low level, and then the voltage at the replica voltage node VREP is increased by receiving the external power voltage node VEXT. The voltage at the replica voltage node VREP that is being increased is decreased by a current $I_{rep}$ of the NMOS transistor 66 that is turned on. That is, the voltage at the replica voltage node VREP is increased to be matched with the voltage at the internal power voltage node VINT that is less than the reference voltage VREF.

If the voltage at the internal power voltage node VINT is greater than the reference voltage VREF, the third amplifier 64 may generate an output signal DO at a logic low level. The output signal DO of the third amplifier 64 at the logic low level turns off the NMOS transistor 66.

If the voltage at the internal power voltage node VINT is greater than the reference voltage VREF, the output signal CO of the first amplifier 52a is generated at a logic high level, the second PMOS transistor that is the second switch 60 is turned off in response to the output signal CO of the first amplifier 52a at the logic high level. This means that, in order to match the voltage at the internal power voltage node VINT of the voltage regulator 50 with the reference voltage VREF, when the voltage at the internal power voltage node VINT is greater than the reference voltage VREF, it is not necessary to couple the external power voltage node VEXT to the internal power voltage node VINT. In order to match the voltage at the replica voltage node VREP with the voltage at the internal power voltage node VINT, the external power voltage node VEXT is not coupled to the replica voltage node VREP.

Thus, in a case where a current $I_{load}$ flowing in the clock generator circuit 56 is changed due to PVT and an operating frequency of a semiconductor device, and the voltage at the internal power voltage node VINT is changed by the changed current $I_{load}$ of the clock generator circuit 56, the replica load circuit 62 generates the voltage at the replica voltage node VREP according to the changed voltage at the internal power voltage node VINT. The replica load circuit 62 forms a closed feedback loop that is fed back the changed voltage at the internal power voltage node VINT.

The voltage at the internal power voltage node VINT generated between the first switch 54 and the clock generator circuit 56 is linked with an operation of the clock generator circuit 56, so that the voltage at the internal power voltage node VINT may be slowly generated, as compared to the voltage at the replica voltage node VREP. For example, due to jitter of the clock generator circuit 56, it may take time to stabilize the voltage at the internal power voltage node VINT. On the other hand, the voltage at the replica voltage node VREP generated between the second switch 60 and the replica load circuit 62 is linked with only operations of the third amplifier 64 and the NMOS transistor 66, so that the voltage at the replica voltage node VREP may be rapidly generated, as compared to the voltage at the internal power voltage node VINT.

The voltage regulator 50 may compare the voltage at the replica voltage node VREP, which is rapidly fed back to the amplifier 52, with the reference voltage VREF, may generate the output signal CO of the amplifier 52 according to a result of the comparison, may control the first switch 54 and the second switch 60 in response to the output signal CO, and may generate the voltage at the internal power voltage node VINT and the voltage at the replica voltage node VREP. Accordingly, the voltage at the internal power voltage node VINT may converge to be matched with the reference voltage VREF.

Figure 6:
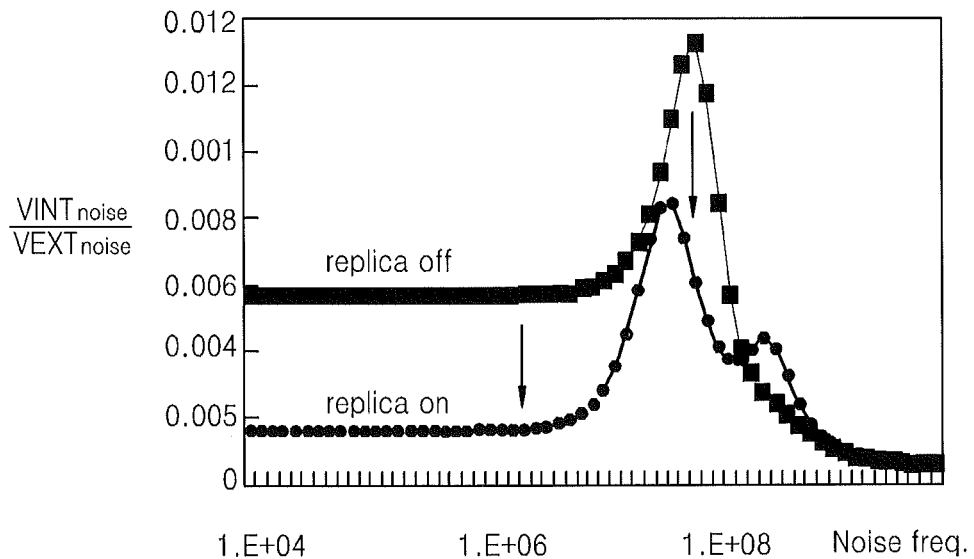
FIG. 6 is a graph that illustrates a characteristic of power noise of the voltage regulator of FIG. 5.

FIG. 6 is a graph that illustrates a characteristic of power noise of the voltage regulator 50 of FIG. 5. Referring to FIG. 6, it can be seen that the power noise (-●-●-) of the voltage regulator 50 of FIG. 5, in which the voltage at the replica voltage node VREP generated according to the voltage at the internal power voltage node VINT is fed back via a closed feedback loop, is less than the power noise (-■-■-) of the voltage regulator 10 of FIG. 2. In particular, it can be seen that the characteristic of power noise of the voltage regulator 50 of FIG. 5 is improved in both a low frequency and a high frequency, as compared to a characteristic of power noise of the voltage regulator 10 of FIG. 2.

Figure 7:
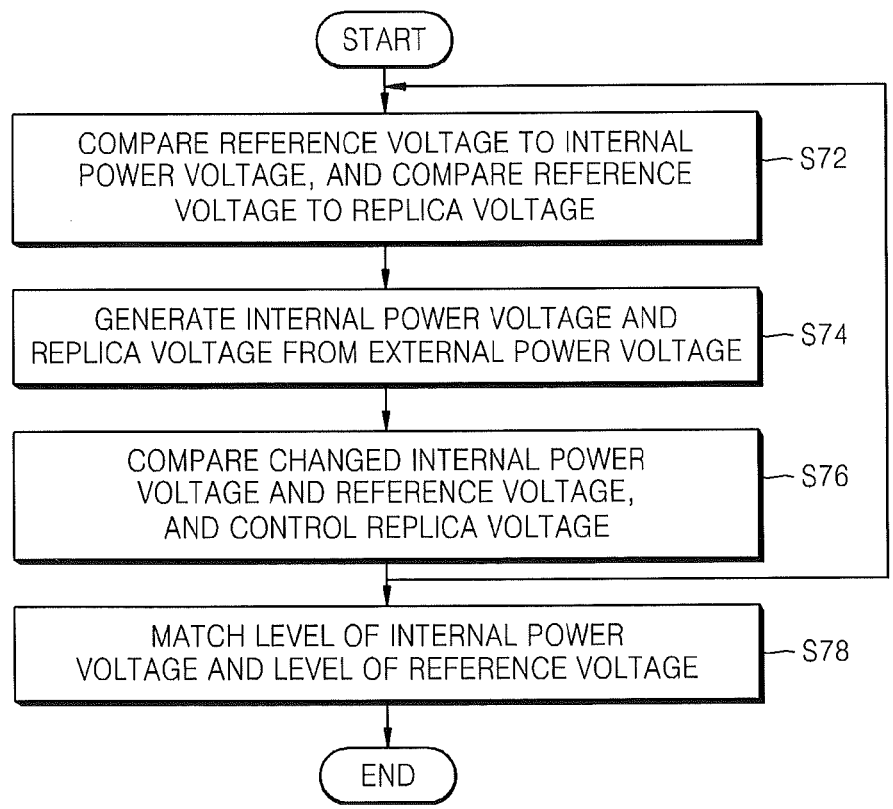
FIG. 7 is a flowchart of a method of generating an internal power voltage, according to some embodiments of the inventive subject matter.

FIG. 7 is a flowchart of a method of generating an internal power voltage, according to some embodiments of the inventive subject matter. Referring to FIG. 7, the method of generating a voltage at an internal power voltage node VINT from an external power voltage node VEXT by using a reference voltage VREF includes operation (S72) of comparing the reference voltage VREF to the voltage at the internal power voltage node VINT, and comparing the reference voltage VREF to a voltage at the replica voltage node VREP. Afterward, the method includes operation (S74) of generating the voltage at the internal power voltage node VINT and the voltage at the replica voltage node VREP from the external power voltage node VEXT according to the results of comparing the reference voltage VREF to the voltage at the internal power voltage node VINT and comparing the reference voltage VREF to the voltage at the replica voltage node VREP.

Since a voltage at the internal power voltage node VINT is changed due to PVT and an operating frequency of a semiconductor device, it is necessary to compensate for a voltage at the replica voltage node VREP according to the level of the changed voltage at the internal power voltage node VINT. For this compensation, the method includes operation (S76) of comparing the changed voltage at the internal power voltage node VINT to the reference voltage VREF, and then controlling the voltage at the replica voltage node VREP according to a result of the comparison. The voltage at the replica voltage node VREP generated according to the level of the changed voltage at the internal power voltage node VINT is fed back to operation S72 so as to be compared in operation S72.

Afterward, by repeatedly performing operations S72 through S76, the voltage at the internal power voltage node VINT converges to be matched with a reference voltage VREF (operation S78).

Figure 8:
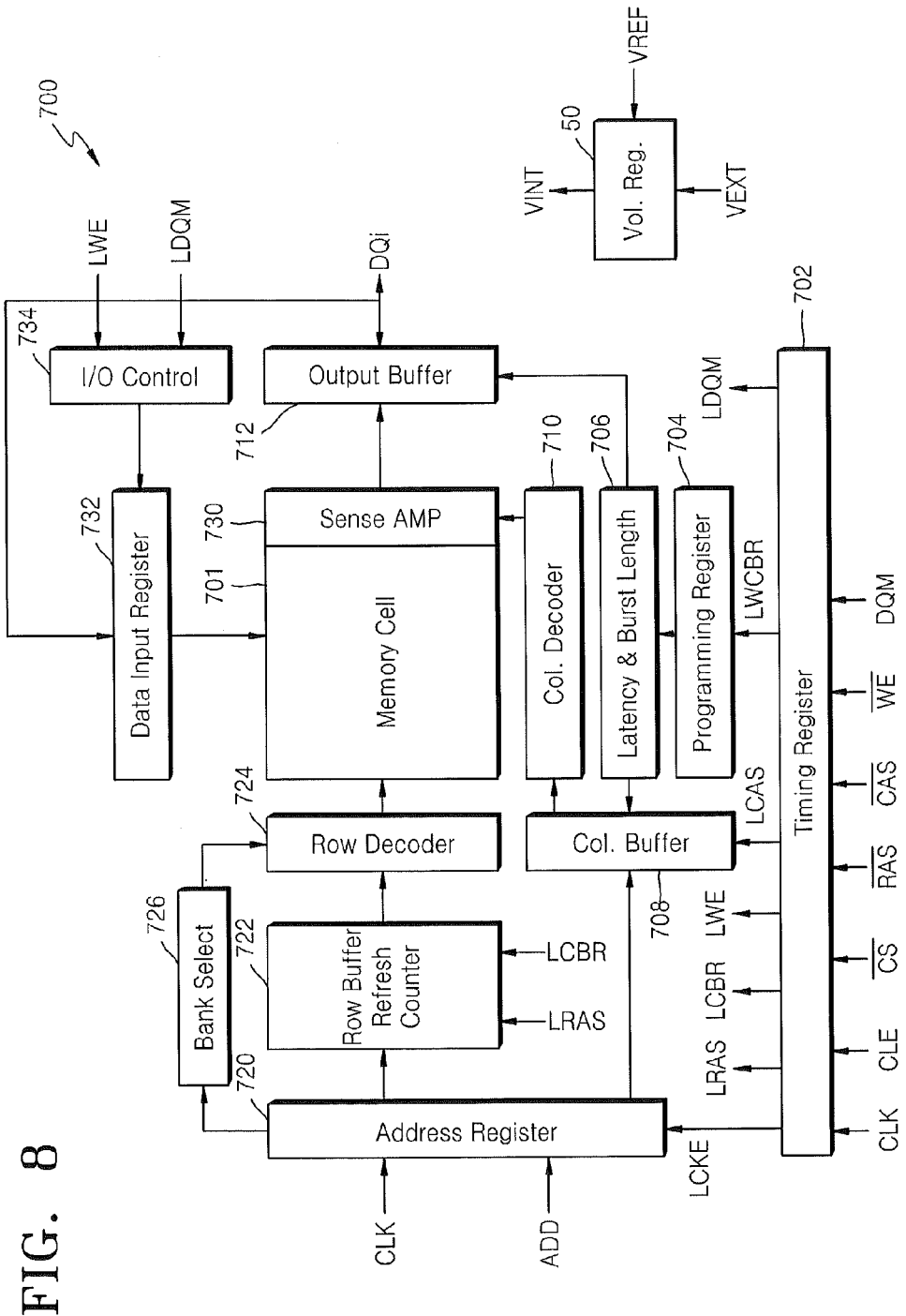
FIG. 8 illustrates an example of a semiconductor device including the voltage regulator of FIG. 5.

The voltage regulator 50 of FIG. 5 according to the previous embodiments may be included in a semiconductor device of FIG. 8. FIG. 8 illustrates an example of the semiconductor device as a memory device 700 formed as a double data rate synchronous dynamic random access memory (DDR-SDRAM) including circuit blocks. Referring to FIG. 8, the memory device 700 may include a memory cell array 701 including a DRAM cell, and the voltage regulator 50 including various circuit blocks for driving the DRAM cell and generating a voltage at an internal power voltage node VINT. The various circuit blocks may use the voltage at the internal power voltage node VINT, which is generated in the voltage regulator 50, as a driving voltage.

The voltage regulator 50 may compare a reference voltage VREF to the voltage at the internal power voltage node VINT, may compare the reference voltage VREF to a voltage at the replica voltage node VREP, and then may generate the voltage at the internal power voltage node VINT and the voltage at the replica voltage node VREP from an external power voltage node VEXT, according to results of the comparison. The voltage regulator 50 generates the voltage at the replica voltage node VREP at the same level as a voltage at the internal power voltage node VINT. However, in order to compensate for the voltage at the replica voltage node VREP according to the voltage at the internal power voltage node VINT changed due to PVT and an operating frequency of the memory device 700, the voltage regulator 50 may compare the reference voltage VREF to the voltage at the internal power voltage node VINT, and may control the voltage at the replica voltage node VREP according to a result of the comparison. In the voltage regulator 50, the voltage at the internal power voltage node VINT converges to be matched with a reference voltage VREF.

A timing register 702 may be activated when a chip selecting signal CS transits from a deactivation level (e.g., logic high) to an activation level (e.g., logic low). The timing register 702 may receive command signals, including a clock signal CLK, a clock enable signal CKE, a chip selecting signal CSB, a row address strobe signal RASB, a column address strobe signal CASB, a write enable signal WEB, and a data input/output mask signal DQM, may process the received command signals, and may generate various internal command signals LRAS, LCBR, LWE, LCAS, LWCBR, and LDQM for controlling the circuit blocks.

Some of the internal command signals generated in the timing register 702 are stored in a programming register 704. For example, latency information or burst length information, which is related to a data output, may be stored in the programming register 704. The internal command signals stored in the programming register 704 may be provided to a latency/burst length control circuit 706, and the latency/burst length control circuit 706 may provide a control signal for controlling a latency or a burst length of the data output to a column decoder 710 or an output buffer 712 via a column buffer 708.

An address register 720 may receive an address signal ADD from an external source. A row address signal may be provided to a row decoder 724 via a row address buffer 722. Also, a column address signal may be provided to the column decoder 710 via the column buffer 708. The row address buffer 722 may further receive a refresh address signal generated in a refresh counter in response to refresh commands LRAS and LCBR, and may provide the row address signal or the refresh address signal to the row decoder 724. Also, the address register 720 may provide a bank signal for selecting a bank to a bank selecting circuit 726.

The row decoder 724 may decode the row address signal or the refresh address signal received from the row address buffer 722, and may activate wordlines of the memory cell array 701. The column decoder 710 may decode the column address signal and may perform a selection operation with respect to bitlines of the memory cell array 701. For example, a column selection line may be applied to the memory device 700, so that the selection operation may be performed by using the column selection line.

A sense amplifier 730 may amplify data of a memory cell selected by the row decoder 724 and the column decoder 710, and may provide the amplified data to an output buffer 712. Data for recording of a data cell may be provided to the memory cell array 701 via a data input register 732, and an input/output controller 734 may control a data delivery operation via the data input register 732.

Figure 9:
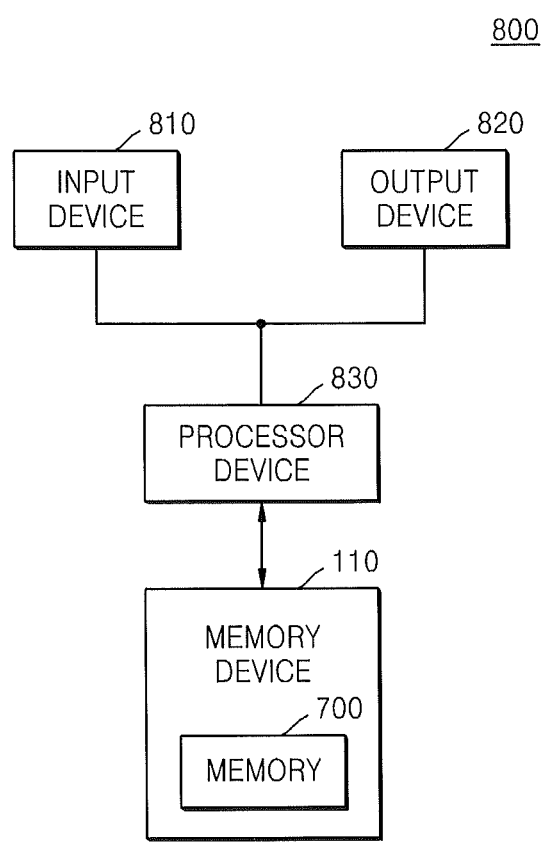
FIG. 9 is a block diagram of an electronic system including a memory device, according to some embodiments of the inventive subject matter.

FIG. 9 is a block diagram of an electronic system 800 including a memory device, according to some embodiments of the inventive subject matter.

Referring to FIG. 9, the electronic system 800 includes an input device 810, an output device 820, a processor device 830, and a semiconductor device 110. The processor device 830 may control the input device 810, the output device 820, and the semiconductor device 110 by using corresponding interfaces. The processor device 830 may include at least one microprocessor, a digital signal processor, a microcontroller, and at least one of logic devices capable of performing similar performances to these elements. The input device 810 and the output device 820 may include at least one selected from the group consisting of a key pad, a keyboard, and a display device.

The semiconductor device 110 may include a volatile memory device such as the DDR-SDRAM 700 of FIG. 8 or a non-volatile memory device such as a flash memory. The semiconductor device 110 may include a voltage regulator according to the one or more embodiments which is fed back a voltage at the replica voltage node VREP generated according to a voltage of an internal power voltage node VINT changed via a closed feedback loop. The voltage regulator may compare a reference voltage VREF to the voltage at the internal power voltage node VINT, may compare the reference voltage VREF to the voltage at the replica voltage node VREP, and then, may generate the voltage at the internal power voltage node VINT and the voltage at the replica voltage node VREP from an external power voltage node VEXT, according to results of the comparison. The voltage regulator generates the voltage at the replica voltage node VREP at the same level as the voltage at the internal power voltage node VINT. However, in order to compensate for the voltage at the replica voltage node VREP according to the voltage at the internal power voltage node VINT changed due to PVT and an operating frequency of the memory device 700, the voltage regulator may compare the reference voltage VREF to the voltage at the internal power voltage node VINT, and may control the voltage at the replica voltage node VREP according to a result of the comparison. The voltage regulator may generate the voltage at the internal power voltage node VINT converging to be matched with a reference voltage VREF.

Figure 10:
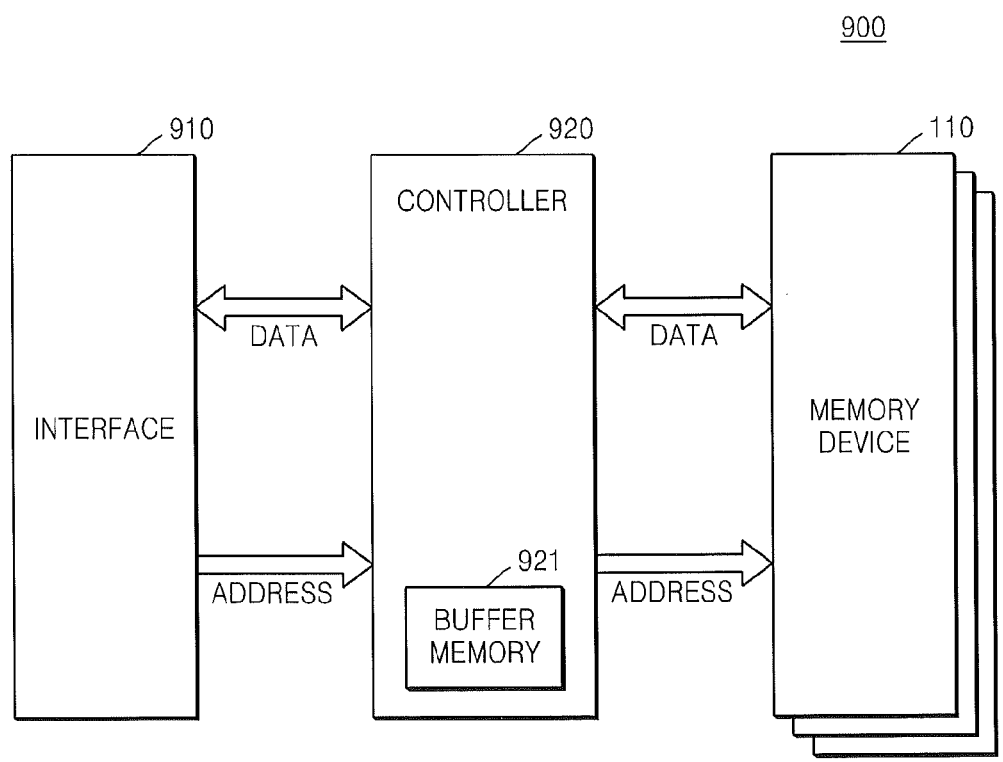
FIG. 10 is a block diagram of a memory system using the semiconductor device, according to some embodiments of the inventive subject matter.

FIG. 10 is a block diagram of a memory system 900 using the semiconductor device 110, according to some embodiments of the inventive subject matter.

Referring to FIG. 10, the memory system 900 may include an interface 910, a controller 920, and the semiconductor device 110. The interface circuit 910 may provide an interface between the memory system 900 and a host apparatus. For the interfacing with the host apparatus, the interface circuit 910 may include a data exchange protocol corresponding to the host apparatus. The interface circuit 910 may be configured to communicate with the host apparatus by using one of various interface protocols including Universal Serial Bus (USB), Multi-Media Card (MMC), Peripheral Component Interconnect-Express, Serial-attached SCSI (SAS), Serial Advanced Technology Attachment (SATA), Parallel Advanced Technology Attachment (PATA), Small Computer System Interface (SCSI), Enhanced Small Disk Interface (ESDI), and Integrated Drive Electronics (IDES).

The controller 920 may receive data and an address provided from an external source via the interface circuit 910. The controller 920 may access the semiconductor device 110 by referring to the data and the address provided from the host apparatus. The controller 920 may deliver data, which is read from the semiconductor device 110, to the host apparatus via the interface circuit 910.

The controller 920 may include a buffer memory 921. The buffer memory 921 temporarily stores write data provided from the host apparatus, or the read from the semiconductor device 110. When data stored in the semiconductor device 110 is cached at a read request from the host apparatus, the buffer memory 921 supports a cache function by which the cached data is directly provided to the host apparatus. In general, a data transmission speed by a bus format (e.g., SATA or SAS) of the host apparatus may be significantly faster than a transmission speed of a memory channel in the memory system 900. That is, in a case where an interface speed of the host apparatus is significantly fast, performance deterioration due to a speed difference may be minimized by providing the buffer memory 921 to the memory channel in the memory system 900.

The semiconductor device 110 may have a voltage regulator according to the one or more embodiments which is fed back a voltage at the replica voltage node VREP generated according to a voltage of an internal power voltage node VINT changed via a closed feedback loop. The voltage regulator may compare a reference voltage VREF to the voltage at the internal power voltage node VINT, may compare the reference voltage VREF to the voltage at the replica voltage node VREP, and then may generate the voltage at the internal power voltage node VINT and the voltage at the replica voltage node VREP from an external power voltage node VEXT, according to results of the comparison. The voltage regulator generates the voltage at the replica voltage node VREP at the same level as the voltage at the internal power voltage node VINT. However, in order to compensate for the voltage at the replica voltage node VREP according to the voltage at the internal power voltage node VINT changed due to PVT and an operating frequency of the memory device 700, the voltage regulator may compare the reference voltage VREF to the voltage at the internal power voltage node VINT, and may control the voltage at the replica voltage node VREP according to a result of the comparison. The voltage regulator may generate the voltage at the internal power voltage node VINT converging to be matched with a reference voltage VREF.

The semiconductor device 110 may be provided as a storage medium of the memory system 900. For example, the semiconductor device 110 may include a resistive memory device. Also, the semiconductor device 110 may include a NAND-type flash memory having large storage capacity. The semiconductor device 110 may include a plurality of memory devices. The semiconductor device 110 that is the storage medium may use a PRAM, a MRAM, a ReRAM, a FRAM, or a NOR flash memory, and a memory system using different types of memory devices may be applied to the semiconductor device 110.

Figure 11:
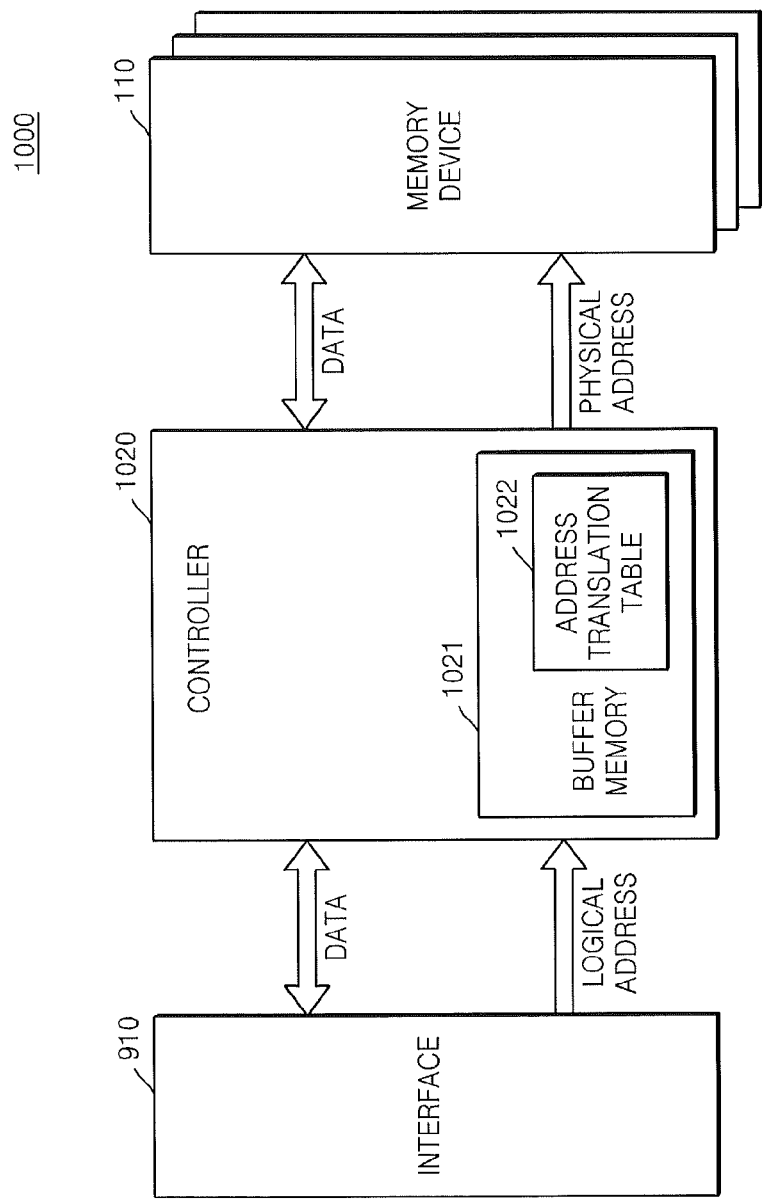
FIG. 11 is a block diagram of a memory system using the semiconductor device, according to further embodiments of the inventive subject matter.

FIG. 11 is a block diagram of a memory system 1000 using the semiconductor device 110, according to further embodiments of the inventive subject matter.

Referring to FIG. 11, the memory system 1000 includes an interface circuit 910, a controller 1020, and the semiconductor device 110. As illustrated in FIG. 10, the interface circuit 910 may include a data exchange protocol corresponding to a host apparatus so as to perform interfacing with the host apparatus. The semiconductor device 110 may include a semiconductor disk device (e.g., a solid-state drive (SSD)) including a flash memory device having a voltage regulator according to the one or more embodiments which is fed back a voltage at the replica voltage node VREP generated according to a voltage of an internal power voltage node VINT changed via a closed feedback loop. The memory system 1000 may be called a flash memory system.

The controller 1020 may include a buffer memory 1021 having an address translation table 1022. The controller 1020 may refer to the address translation table 1022 and then may translate a logical address provided by the interface circuit 910 to a physical address. The controller 1020 may access the semiconductor device 110 by referring to the translated physical address.

The memory systems 900 and 1000 of FIGS. 10 and 11 may be mounted in an information processing apparatus, including a personal digital assistant (PDA), a portable computer, a web tablet, a digital camera, a portable media player (PMP), a mobile phone, a wireless phone, or a laptop computer. The memory systems 900 and 1000 may include an MMC card, a secure digital (SD) card, a micro SD card, a memory stick, an identification (ID) card, a personal computer memory card international association (PCMCIA) card, a chip card, a USB card, a smart card, or a compact flash (CF) card.

Figure 12:
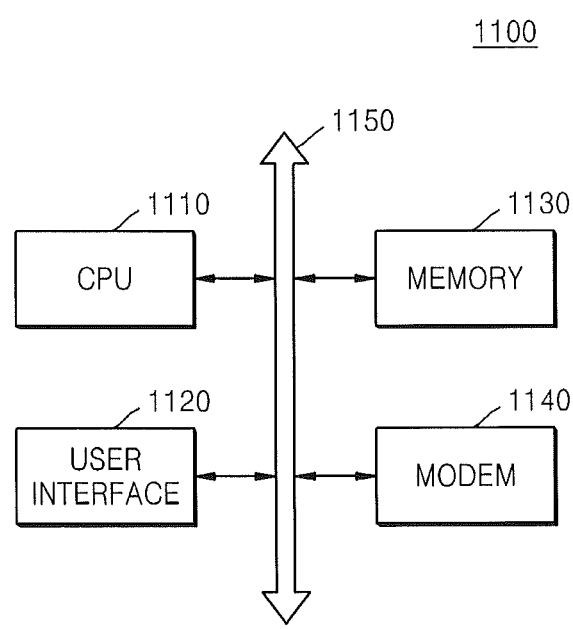
FIG. 12 illustrates a computer system including a semiconductor device, according to some embodiments of the inventive subject matter.

FIG. 12 illustrates a computer system 1100 including a semiconductor device, according to some embodiments of the inventive subject matter.

Referring to FIG. 12, the computer system 1100 may include a central processing circuit (CPU) 1110, a user interface 1120, a memory 1130, and a modem 1140 such as a baseband chipset that are electrically connected to a system bus 1150. The user interface 1120 may transmit data to a communication network or may receive data from the communication network. The user interface 1120 may be wired or wireless and may include an antenna or a wire-wireless transceiver. Data provided via the user interface 1120 or the modem 1140, or processed by the CPU 1110 may be stored in the memory 1130.

The memory 1130 may include a volatile memory device such as a DRAM and/or a non-volatile memory device such as a flash memory. The memory 1130 may include a DRAM, a PRAM, a MRAM, a ReRAM, a FRAM, a NOR flash memory, an NAND flash memory, or a fusion flash memory (e.g., a memory formed by combining a SRAM buffer, a NAND flash memory and a NOR interface logic), which has a voltage regulator according to the one or more embodiments which is fed back a voltage at the replica voltage node VREP generated according to a voltage of an internal power voltage node VINT changed via a closed feedback loop.

When the computer system 1100 according to the present embodiments is a mobile device, a battery (not shown) may be additionally provided to supply an operating voltage to the computer system 1100. Although not illustrated in FIG. 12, the computer system 1100 according to the present embodiments may further include an application chipset, a camera image processor (CIP), an input/output device, and the like.

When the computer system 1100 according to the present embodiments is a device performing wireless communication, the computer system 1100 may be used in computer systems, including Code Division Multiple Access (CDMA), Global System for Mobile communication (GSM), North American Multiple Access (NADC), CDMA2000, or the like.

While the inventive subject matter has been particularly shown and described with reference to exemplary embodiments thereof, it will be understood that various changes in form and details may be made therein without departing from the spirit and scope of the following claims.

What is claimed is:

1. An integrated circuit device comprising:
   an external power supply node configured to be connected to an external power supply;
   an internal power supply node configured to provide power to internal circuitry of the integrated circuit device;
   a replica power supply node;
   a replica load circuit coupled to the replica power supply node; and
   a regulator circuit configured to generate an internal power supply voltage at the internal power supply node and a replica power supply voltage at the replica power supply node from the external power supply responsive to the replica power supply voltage, wherein the regulator circuit comprises:
      an amplifier circuit configured to generate an output signal responsive to both of a comparison of the reference voltage to the internal power supply voltage and a comparison of the reference voltage to the replica voltage;
      a first switch coupled to the amplifier circuit and configured to receive the output signal and selectively couple the external power supply node to the internal power supply node responsive to the output signal; and
      a second switch coupled to the amplifier circuit and configured to receive the output signal and selectively couple the external power supply node to the replica power supply node responsive to the output signal.

2. The integrated circuit device of claim 1, wherein the amplifier circuit comprises:
   a first amplifier configured to compare the reference voltage to the replica power supply voltage; and
   a second amplifier having an output coupled to an output the first amplifier and configured to compare the reference voltage to the internal power supply voltage, wherein the output signal is generated at the outputs of the first and second amplifier circuits.

3. The integrated circuit device of claim 1, wherein the first and second switches comprise respective first and second p-channel metal-oxide-semiconductor field-effect (PMOS) transistors.

4. The integrated circuit device of claim 1, wherein the replica load circuit comprises:

an amplifier circuit configured to comparing the reference voltage to the internal power supply voltage to generate an output signal; and a switch coupled to the amplifier circuit and configured to selectively couple the replica power supply node to a ground node responsive to the output signal.

5. The integrated circuit device of claim 4, wherein the switch comprises an n-channel metal-oxide-semiconductor field-effect (NMOS) transistor.

6. An integrated circuit device comprising:

an external power supply node configured to be connected to an external power supply;

an internal power supply node configured to provide power to internal circuitry of the integrated circuit device;

a replica power supply node;

a replica load circuit coupled to the replica power supply node; and a regulator circuit configured to generate an internal power supply voltage at the internal power supply node and a replica power supply voltage at the replica power supply node from the external power supply responsive to the replica power supply voltage, wherein the regulator circuit comprises:

a first amplifier configured to compare a reference voltage to the replica power supply voltage;

a second amplifier configured to compare the reference voltage to the internal power supply voltage;

a switch having a control terminal coupled to outputs of the first and second amplifiers and configured to selectively couple the external power supply node to the replica power supply node responsive to an output signal at the outputs of the first and second amplifiers.

7. The integrated circuit device of claim 6, wherein the switch comprises a first switch and wherein the regulator circuit further comprises a second switch having a control terminal coupled to the outputs of the first and second amplifiers and configured to selectively couple the external power supply node to the internal power supply node responsive to the output signal.

* * * * *